United States Patent [19]

Noble et al.

[11] Patent Number: 4,811,480
[45] Date of Patent: Mar. 14, 1989

[54] COMPONENT SUPPLY APPARATUS

[75] Inventors: Peter J. W. Noble, Dorchester; Geoffrey D. Maskens, Blanford, both of Great Britain

[73] Assignee: Ambotech Limited, Dorchester, England

[21] Appl. No.: 134,564

[22] Filed: Dec. 18, 1987

Related U.S. Application Data

[63] Continuation of Ser. No. 858,189, filed as PCT GB85/00348 on Aug. 5, 1985, published as WO86/01366 on Feb. 27, 1986, abandoned.

[30] Foreign Application Priority Data

Aug. 7, 1984 [GB] United Kingdom ............... 8420064
Nov. 20, 1984 [GB] United Kingdom ............... 8429272
Dec. 12, 1984 [GB] United Kingdom ............... 8431311

[51] Int. Cl.⁴ ............................................. B23Q 7/10
[52] U.S. Cl. ................................. 29/809; 198/773; 221/89
[58] Field of Search ................. 29/741, 809; 221/75, 221/89, 87, 88; 198/774, 773

[56] References Cited

U.S. PATENT DOCUMENTS

| | | | |
|---|---|---|---|
| 1,965,868 | 7/1934 | Vickers | 198/774 |
| 2,701,077 | 2/1955 | Palmer | 221/75 |
| 2,921,550 | 1/1960 | Goodykoontz, Jr. et al. | 29/741 X |
| 3,168,964 | 2/1965 | Davis | 221/88 |
| 3,411,664 | 11/1968 | Davis | 221/88 |
| 3,512,628 | 5/1970 | Keough | 198/774 |
| 4,054,200 | 10/1977 | Bartos | 198/774 |
| 4,250,615 | 2/1981 | Knuth et al. | 29/809 X |
| 4,437,580 | 3/1984 | Ferrin | 221/75 |

FOREIGN PATENT DOCUMENTS

| | | |
|---|---|---|
| 0116922 | 8/1984 | European Pat. Off. |
| 2147203 | 3/1973 | Fed. Rep. of Germany |
| 2107817 | 5/1972 | France |
| 2194630 | 3/1974 | France |

*Primary Examiner*—P. W. Echols
*Assistant Examiner*—Joseph M. Gorski
*Attorney, Agent, or Firm*—Klarquist, Sparkman, Campbell, Leigh & Whinston

[57] ABSTRACT

According to the present invention there is provided apparatus for supplying components for insertion into a printed circuit board, which apparatus comprises a component dispenser, the component dispenser having first and second substantially parallel elongate support elements for supporting components at locations spaced-apart along the lengths thereof and structure for allowing relative movement of the first and second support elements both transversely of and parallel to the length of the first support element so that, in use of the apparatus, relative movement of the first and second support elements of the dispenser causes components supported by one of the support elements to be transferred to the other support element and then returned to the one support element at positions which are advanced along the one support element from the previous positions thereof whereby the components may be supplied one by one from the dispenser.

1 Claim, 5 Drawing Sheets

COMPONENT SUPPLY APPARATUS

This application is a continuation of application Ser. No. 858,189 filed as PCT GB85/00348 on Aug. 5, 1985, published as WO86/01366 on Feb. 27, 1986, now abandoned.

This invention relates to apparatus for supplying components for insertion into a printed circuit board.

According to the present invention there is provided apparatus for supplying components for insertion into a printed circuit board, which apparatus comprises a component dispenser, the component dispenser having first and second substantially parallel elongate support means for supporting components at locations spaced-apart along the lengths thereof and means for allowing relative movement of the first and second support means both transversely of and parallel to the length of the first support means so that, in use of the apparatus, relative movement of the first and second support means of the dispenser causes components supported by one of the support means to be transferred to the other support means and then returned to the one support means at positions which are advanced along the one support means from the previous positions thereof whereby the components may be supplied one by one from the dispenser.

For a better understanding of the present invention, and to show how the same may be put into effect, reference will now be made, by way of example, to the accompanying drawings, in which.

Figure 1:
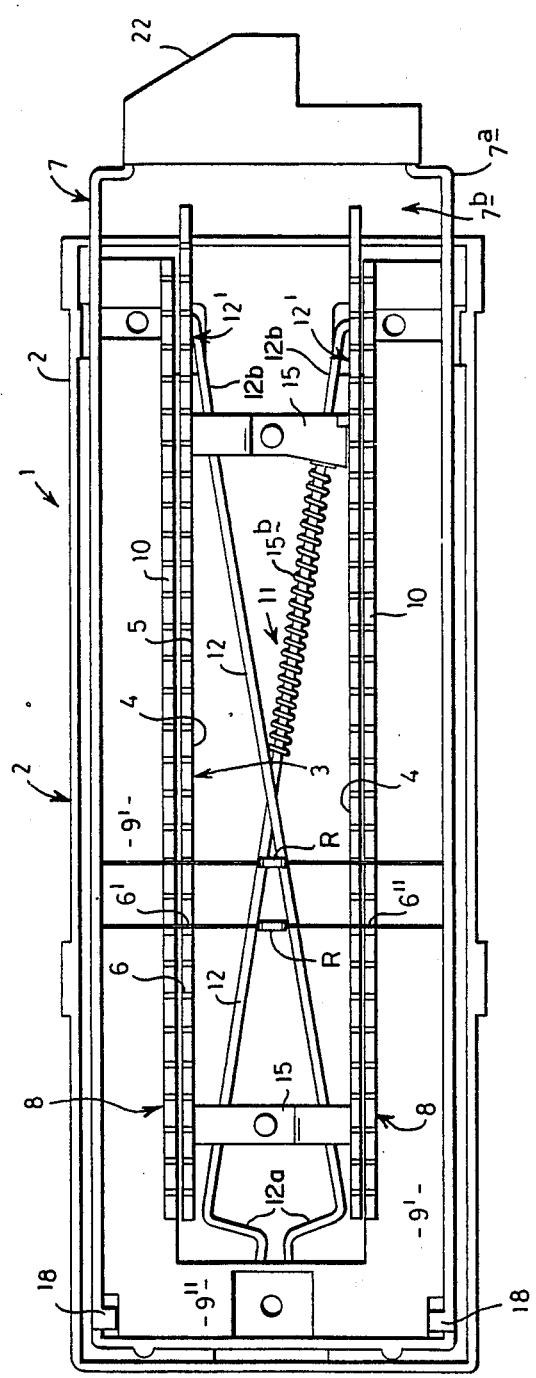
FIG. 1 is a top plan view of a component dispenser of apparatus in accordance with the invention.
Figure 2:
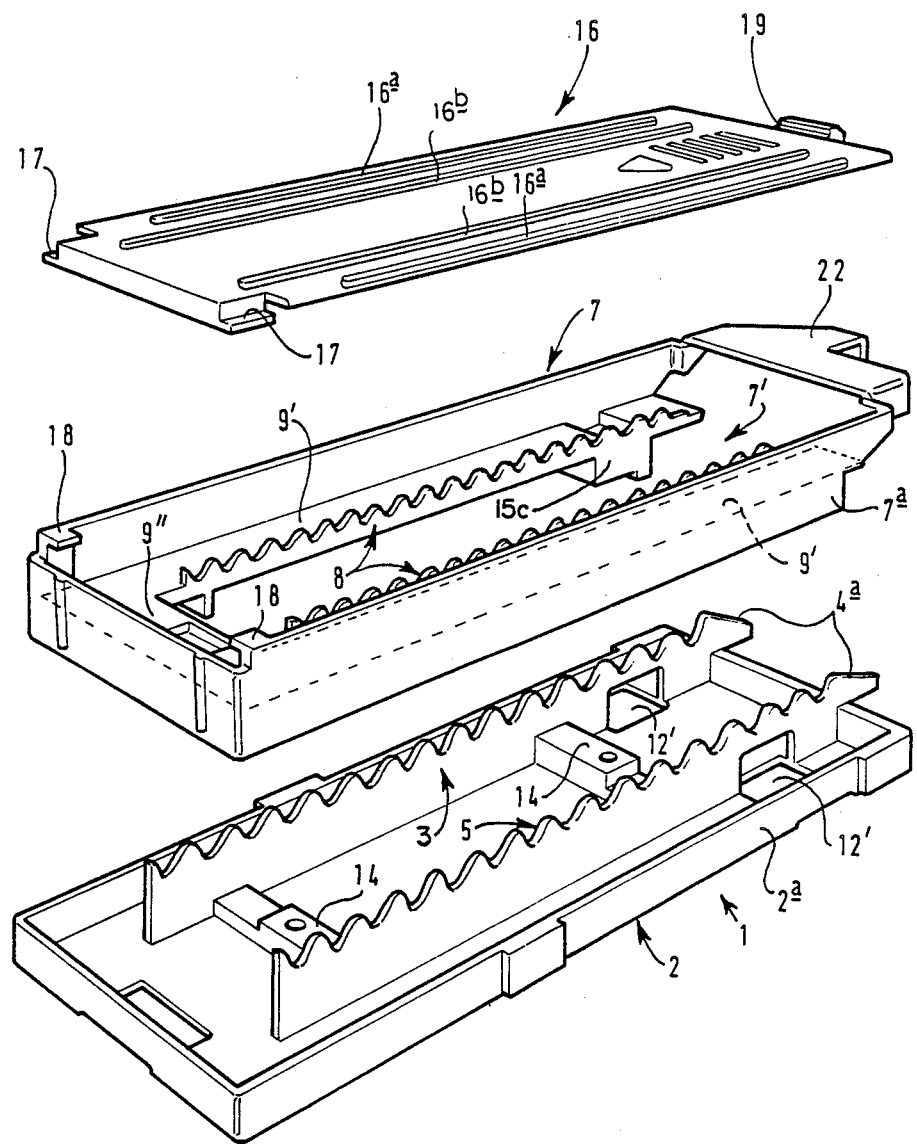
FIG. 2 is an exploded perspective view of the dispenser of FIG. 1.

Referring now to the drawings, FIGS. 1 and 2 illustrate a component dispenser 1 for supplying electronic components such as resistors, capacitors etc. to a component insertion device (not shown) for automatically inserting components into a printed circuit board.

As shown in FIGS. 1 and 2, the dispenser 1 comprises a substantially rectangular base 2 to which is mounted a first support means 3 for supporting components to be supplied to the component insertion device (not shown). The first support means 3 comprises two parallel spaced-apart walls 4 extending perpendicularly to the base 2 parallel to the length of the base 2. The top or free elongate edge of each wall 4 is serated or formed with a plurality of teeth 5 so that the troughs between the crests of the teeth 5 provide support locations 6 for the leads of components to be supplied from the dispenser. Thus the case of a two lead device, such as a resistor R or capacitor, one lead of the component will rest in the support location 6' formed by the trough between two teeth on one wall and the other lead will rest in the opposite support location 6" formed by the trough between the corresponding two teeth in the other wall 4.

The perimeter of the base 2 is surrounded by a boundary wall 2a which extends upwardly therefrom. A frame 7 is mounted to the base 2 by guide means 11 so as to fit between the boundary wall 2a of the base and the two toothed walls 4. The frame 7 is formed by two parallel elongate frame members 9' and a shorter frame member 9" extending perpendicularly of the elongate frame members so that one end 7b of the frame 7 is open. A wall 8 extends upwardly from the inner edge of each of the frame members 9. Each wall 8 is formed with a plurality of teeth 10 and lies immediately adjacent and parallel to a respective toothed wall 4.

As will be described below in more detail, the guide means 11 act to maintain the frame 7 parallel to the base 2 and also allow movement of the frame 7 relative to the base 2 in directions both perpendicularly to the base 2 and parallel to the length of the base 2. As will be described in greater detail below, such movement of the frame 7 allows compartments to be transferred from support location to support location along the first support means 3, the toothed walls 8 forming temporary or second support means during the transfer process.

The frame 7 has a boundary wall 7a extending around three edges thereof so that the frame 7 has a substantially T-shaped cross-section. At the open end 7' of the frame the boundary wall 7a extends beyond the frame 7 and is shaped to form a hook-like member 22 for engaging an actuating member 13 (FIGS. 3A and B) which, as will be described below, is used to effect movemen frame 7 relative to the base 2.

As can be seen from FIG. 1, the toothed walls 4 of the base 2 are of such a height as to extend into a gap or opening 7b defined between the hook-like member 22 and the frame 7 so that as the frame 7 is moved by the actuating member the component resting on the support locations adjacent the ends of the walls 4 will travel over the downwardly sloping ends 4a thereof to a collecting channel (not shown in FIGS. 1 and 2) for supply to a component insertion device (not shown).

As shown in FIG. 1, the guide means 11 comprises two crossed links or crank members 12, each crank member 12 extending generally diagonally of the base. The two crank members 12 are supported spaced from the base by stepped support walls 14 (FIG. 2) extending transversely of and upwardly from the base. A complementarily stepped retaining plate 15 is secured to each stepped support wall 14 so that a respective channel 15a for each crank member 12 is defined between each stepped support wall 14 and the corresponding stepped retaining plate 15. One end 12a of each crank member 12 is rotatably received in a channel formed in the underside of the frame member 9" and secured thereof by means of a retaining plate and split pin while the other end 12b of each crank member 12 extends through a rectangular aperture 12' formed in the associated wall 4 and is rotatably received in a respective channel formed in a respective support block 15c secured to the boundary wall 7a and secured in place by a retaining plate and split pin arrangement.

The height of the apertures 12' and the channels 15a determines the maximum vertical distance through which the crank members 12 may move while the length of the apertures 12' determines the maximum horizontal distance through which the crank members 12 may move.

A combined compression and torsion spring 15b is provided on one of the crank members 12 to bias the frame 7 into a rest condition in which the crests of the teeth lie slightly below the troughs of the teeth 5 and the shortest end of the boundary wall 7a of the frame is positioned adjacent the corresponding end of the base 2.

A slidable lid 16 for closing the frame 7 is provided. The lid 16 has at one shorter end thereof opposed projections 17 which slidably engage in respective guide slots formed by projections 18 provided on the boundary wall 7a of the frame. A tongue 19 provided at the other shorter end of the lid 16 engages under the hook-like member 22 to hold the lid 16 in place. The lid 16 is also formed with outer guide rails 16a to guide sliding movement of the lid during the opening and closing thereof. Inner guide rails 16b provided on the lid act to secure the components in their support locations when the frame 7 is in the rest position relative to the base.

Preferably, the base, frame and lid are formed of a plastics material and conveniently the lid is transparent or semi-transparent so as to enable the components inside the dispenser 1 to be easily identified without removing the lid 16.

In order to use the dispenser 1, the lid 16 is first removed by pressing downwardly and away from the hook-like member 22 so that the lid slides backwards to allow components to be loaded into the dispenser. The lid 16 is then replaced by first inserting the projections 17 into the guide slots 18 on the frame 7 and then sliding and pushing the tongue 19 beneath the hook-like member 22 so that the inner guide rails 16b on the lid hold the components in the support locations 6. It should, of course, be appreciated that the components may be loaded into the dispenser either by machine or by hand and that, in either case, the axial leads will be first cut to a standard length.

As mentioned above, in use of the dispenser 1 an actuating member 13 is brought into engagement with the hook-like member 22 and the actuating member is caused to move, for example by the means that will be described below, so that the frame 7, (which in effect forms a shuttle) is first raised from the base 2 by a distance slightly greater than the height of the crests of the teeth 5 so that components supported on support locations on the first support means 3 are transferred to the second support means formed by the toothed walls 8, the actuating member 13 is then moved to pull the hook-like member 22, and therefore the frame or shuttle 7, horizontally against the biasing force of the spring 7 and the shuttle is then allowed to return to its original position under the spring biasing force causing the components to be returned to the first support means formed by the toothed walls 4 at support locations one pitch of the teeth nearer the dispenser opening so that the component at the support locations adjacent the dispenser opening falls from the dispenser into a collecting channel (not shown in FIGS. 1 and 2) for supply to a component insertion device.

The dispenser 1 shown in FIGS. 1 and 2 is intended to form part of apparatus for supplying a variety of different components to a component insertion device.

The apparatus comprises a rectangular frame (not shown) supporting slotted carriers (not shown) into which a plurality of dispensers 1 are stacked and secured by means of a notched bar. In a preferred arrangement each carrier is capable of holding twenty dispensers 1 and the frame is capable of holding eight carriers so that the frame stores 160 dispensers allowing one hundred and sixty different types of components to be dispensed therefrom.

The frame thus carries a matrix of dispensers 1 and each row of dispensers is associated with a respective collecting channel (not shown) for supplying components dispensed from the dispensers to a collection point for supply to a component insertion device.

The apparatus also includes means for selecting the particular dispenser from which a component is required and for controlling relative movement of the base 2 and shuttle or frame 7 of the selected dispenser.

Figure 3A:
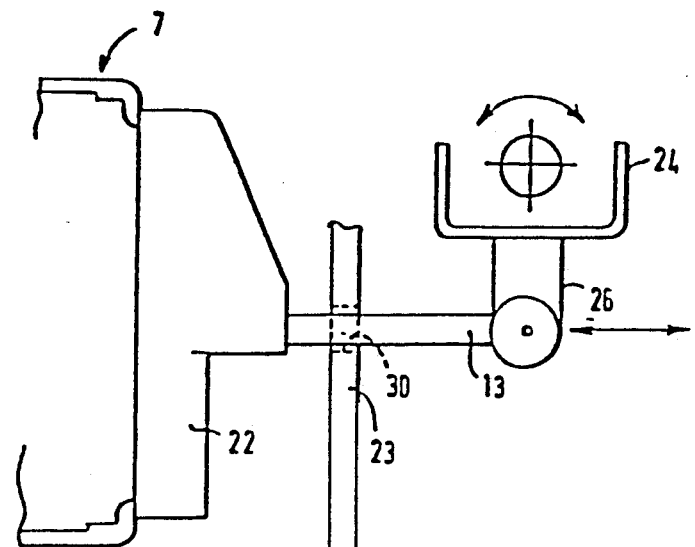
FIGS. 3A and 3B illustrate a top plan view and a side plan view respectively of a part of a matrix of dispensers.
Figure 3A:
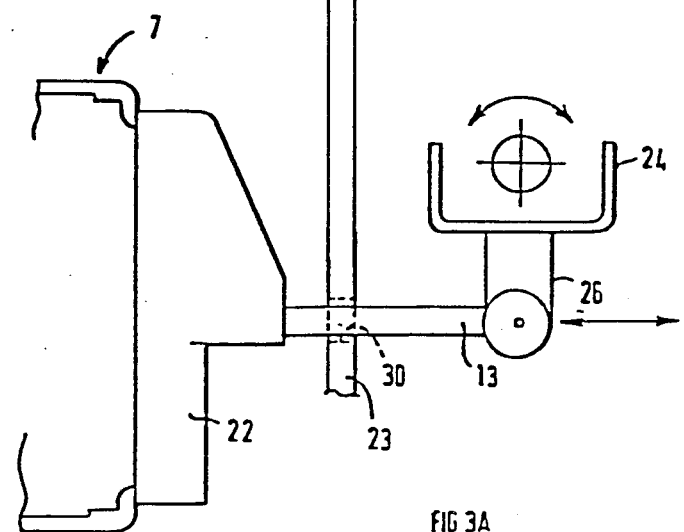

Referring now to FIG. 3A, the means for selecting the particular dispenser and for controlling the relative movement of the base and shuttle comprise a plurality of solenoid-actuated selection rods 23 each selection rod 23 extending parallel to a respective row of the matrix of dispensers and a plurality of control members, each control member extending perpendicularly of the selection rods 23 and parallel to a column of the matrix of dispensers.

Figure 3B:
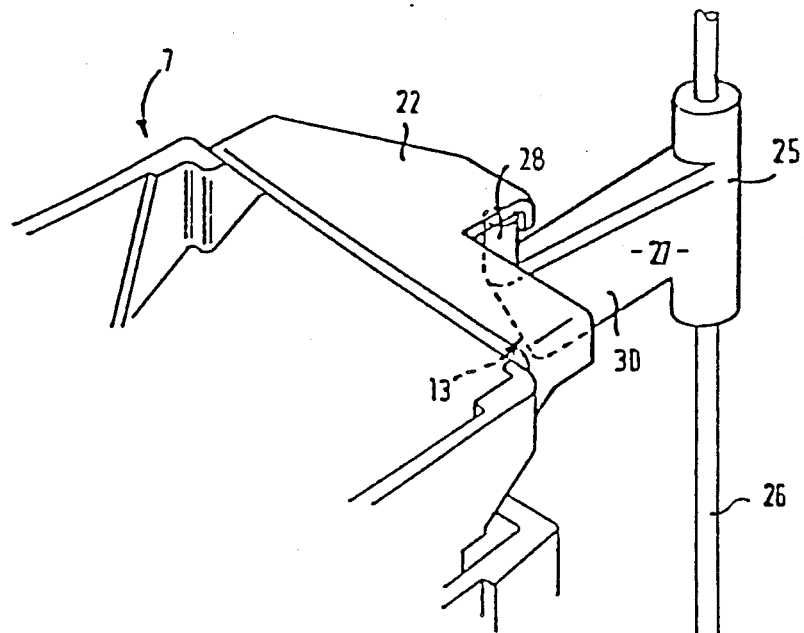
Figure 3B:
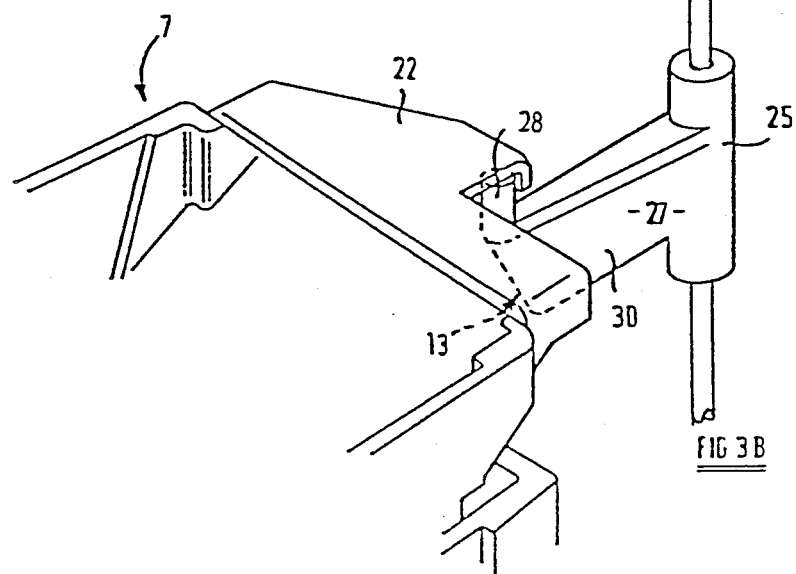
Figure 4:
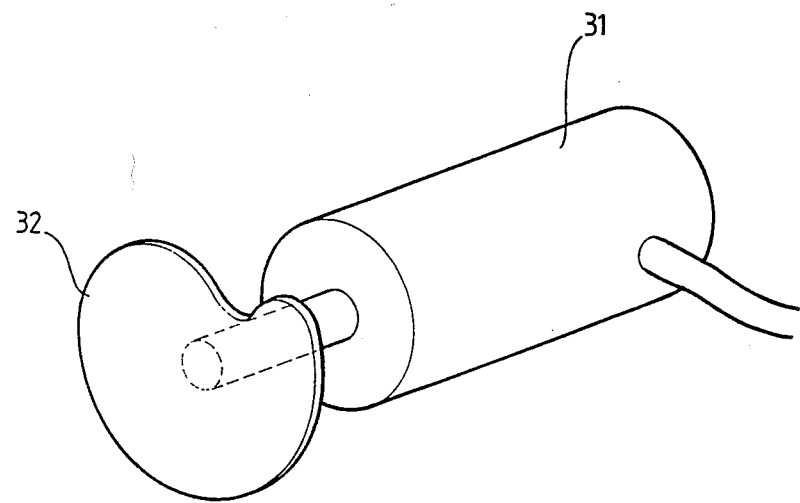
FIG. 4 illustrates a motor and cam arrangement for actuating controlling and selecting means of apparatus in accordance with the invention.

FIG. 3B shows the association of an actuating member 13 with the corresponding dispenser, the associated selection rod 23 having been omitted from FIG. 3B in the interests of clarity. Each actuating member 13 comprises a cylindrical section 25 formed with an axial bore so that the actuating members associated with a particular column of dispensers can be rotatably mounted on a respective column rod 26 of the associated control member. A rectangular-shaped arm 27 extends radially of the cylindrical section 25 of the actuating member 13 and is formed with a cylindrical projection 28 which extends parallel to the cylindrical section 25 and is arranged to engage the hook-like member 22 of the associated dispenser when that dispenser is selected.

Each column rod 26 extends parallel to a column of the matrix of dispensers and is fixedly mounted to a respective control rod 24 in the form of a channel-shaped member which is rotatable about a semi circle about an offset axis to move the corresponding actuators approximately 5 mm in a direction parallel to the length of the dispenser. Each column rod 26 is associated with a respective column solenoid which when actuated causes the column rod to move parallel to the column through a distance of approximately 6 mm.

As shown in FIG. 3A each selection rod 23 is formed with a plurality of apertures 30 and the arm 27 of each actuating member associated with the selection rod extends through a respective aperture 30 in the selection rod 23 so that, when the selection rod 23 is moved by the associated solenoid, all the actuating members 13 carried thereby move transversely of the length of the corresponding dispensers 1 to engage the respective hook-like members 22 thereof.

In use of the apparatus, each dispenser is first loaded with the selected component as described above and the dispensers are then stacked in the carriers in the frame.

Selection of the component to be dispensed is carried out under computer control. Thus, in accordance with preprogrammed instructions, the computer will cause the solenoid associated with the selection rod 23 of the row of dispensers containing the desired dispenser to be actuated to move the selection rod to bring the actuating members 13 associated with the selection rod into engagement with their respective hook-like members 22. Next, the computer causes the solenoid associated with the column rod 26 carrying the actuating members associated with the column containing the desired dispenser 1 to be actuated so engaging the actuating members in that column with a motor 31 and cam 32 arrangement forming a square motion drive. The motor and cam arrangement causes the actuating member of the desired dispenser to be raised to raise the shuttle 7. Then the corresponding channel-shaped control rod 24 is rotated to move the shuttle along the length of the dispenser and next the shuttle is allowed to move first vertically and then horizontally under the influence of gravity and the spring 15b to complete the square and so return the shuttle to its rest position having moved all the components stored in the dispenser along one place and having caused the leading component to be dispensed from the dispenser opening into the associated collection channel. Operation of the channel shaped control rod 24, as mentioned above, is controlled by a square motion motor and cam arrangement. The computer will then cause the above operations to be repeated for each desired component by actuating the dispenser containing the desired component by having the appropriate control rod and selection rod solenoids actuated in accordance with preprogrammed instructions.

The entire frame or assembly is tilted at an angle of approximately 25° to the horizontal to enable the components to slide under gravity from the dispenser along the collecting channels to a substantially vertical channel which delivers the components to the same point irrespective of the dispenser from which they originated.

It should of course be appreciated that the dispensers may be adapted to the size and shape of the components to be dispensed. Thus, in particular, where the components have a body diameter greater than the pitch of the teeth of the support means, then they may be accomodated by loading, for example, alternate support locations in the dispenser and by causing the shuttle to execute two lifting and moving cycles to dispense a component.

Thus, the present invention provides apparatus for supplying components for insertion into a printed circuit board, which apparatus comprises a component dispenser, the component dispenser having first and second substantially parallel elongate support means for supporting components at locations spaced-apart along the lengths thereof and means for allowing relative movement of the first and second support means both transversely of and parallel to the length of the first support means so that, in use of the apparatus, relative movement of the first and second support means of the dispenser causes components supported by one of the support means to be transferred to the other support means and then returned to the one support means at positions which are advanced along the one support means from the previous positions thereof whereby the components may be supplied one by one from the dispenser.

Conveniently, means are provided for effecting and controlling relative movement of the first and second support means of the dispenser.

In a preferred arrangement a plurality of the dispensers are provided and usually means are provided for effecting and controlling relative movement of the first and second support means of a selected dispenser. The movement effecting and controlling means may comprise a respective actuating member engageable with each dispenser and selecting means for bringing the actuating member of a selected dispenser into engagement therewith. The selecting means may comprise a plurality of selection members, each selection member carrying a plurality of actuating members and being movable so as to move the actuating members into and out of engagement with the corresponding dispensers. Preferably, each selection rod is formed with a plurality of apertures, each aperture receiving a respective actuating member.

Normally, the movement effecting and controlling means comprises a plurality of control members each control member being connected to the actuating members associated with a number of dispensers to move the actuators to cause relative movement of the first and second support means of a dispenser selecting by the selection means. Each control member may comprise a control rod to which the connected actuating members are rotatably mounted and a channel-member fixedly mounted to the control rod, the control rod being movable parallel to the length thereof and the channel-member being rotatable about an axis offset therefrom to move the connected actuators to effect relative movement of the first and second support means of a dispenser selected by the selection means.

Conveniently, the control rods and/or the selection members are solenoid actuated.

The dispensers may be arranged in a matrix and the selection members and control members may be arranged so as to be perpendicular to one another, one of the selection members and control members being parallel to the rows of the matrix and the other to the columns of the matrix. Usually, the dispensers are stacked in slotted carriers which may be stacked in a frame. Generally, the frame is dispensed at an angle to the vertical so that the rows and columns of the matrix of dispensers are at an angle to the vertical. Each column or row of dispensers may be associated with a respective common collection channel for supplying components dispensed from the dispensers to a component insertion device.

Conveniently, the relative movement effecting and controlling means is actuated by a cam and motor arrangement.

Usually, the first and second support means of the or each dispenser each comprise two parallel support walls provided with a plurality of support locations for components and, for the or each dispenser, the support walls forming the first support means may be disposed inside the support walls forming the second support means and in a position of the rest of the dispenser the support locations of the second support means lie below those of the first support means. Generally, for the or each dispenser, the first support means are mounted to a base and the second support means are mounted to a frame which is mounted to the base by guide means, which may comprise two crossed crank members, for maintaining the base parallel to the frame. Advantageously, the guide means carries biasing means for biasing the frame into the rest position of the second support means.

Also the relative movement effecting and controlling means may cause the components of the or the selected dispenser to move along the one support means from one support location of the one support means to another so that the component and the support location adjacent on opening of the dispenser is dispensed.

We claim:
1. Apparatus for supplying electrical components for insertion into a printed circuit board, said apparatus having a plurality of dispensers, each dispenser comprising:
   a horizontally disposed rectangular base;
   a pair of parallel spaced-apart support walls extending vertically upward from said base, the top edge of each said support wall being serrated to define a series of troughs arranged in opposed pairs each for supporting a component between said support walls with a respective lead of the component rest- ing in a respective one of the opposed pair of troughs;

a downwardly sloping end portion formed on each said support wall at one end of said base to guide a component having its leads placed on said end portion downwardly and out of the dispenser;

a horizontally disposed frame defining a rectangular aperture having a pair of longitudinal edges, said frame normally being seated on the base in a rest position with said support walls projecting upwardly through the frame aperture adjacent respective ones of said longitudinal edges of the aperture;

a pair of transport walls extending upwardly from said frame along said longitudinal edges of the frame aperture adjacent said support walls of said base, the top edge of each said transport wall being serrated to define a series of troughs arranged in opposed pairs each for receiving the leads of a component to support the component between said transport walls, the troughs of said transport walls being located below the troughs of the support walls in the rest position of said frame;

guide means coupling said base and said frame together for limited movement of said frame relative to said base while maintaining said frame parallel to said base, said guide means permitting movement of said frame relative to said base in the upward direction and in the direction towards the one end of said base;

biasing means acting to bias said frame into its rest position relative to said base; said apparatus further having a plurality of actuating members, each actuating member engageable with a corresponding dispenser;

a plurality of selection members, each selection member carrying some of said plurality of actuating members into and out of engagement with the corresponding dispensers;

a plurality of control members, each being connected to some of said plurality of actuating members and each comprising a control rod to which the connected actuating members are rotatably mounted and a channel-member fixedly mounted to the control rod, the control rod being movable along the lengthwise axis thereof and the channel-member being rotatable about an axis offset therefrom to move the connected actuators to effect displacement of the frame of a dispenser selected by the selection member;

so that each component is lifted from said support walls of said base by said transport walls of said frame, shifted towards said one end of said base and again deposited on said support walls at a position nearer said one end of said base such that a leading component is deposited on said end portions of said support walls and thereby dispensed from said dispenser.

* * * * *